US006782105B1

(12) United States Patent
Sahara et al.

(10) Patent No.: US 6,782,105 B1
(45) Date of Patent: Aug. 24, 2004

(54) REFLECTION SOUND GENERATOR WITH SERIES OF MAIN AND SUPPLEMENTARY FIR FILTERS

(75) Inventors: Shinichi Sahara, Hamamatsu (JP); Yasushi Shimizu, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 09/447,282

(22) Filed: Nov. 23, 1999

(30) Foreign Application Priority Data

Nov. 25, 1998 (JP) .......................................... 10-350772

(51) Int. Cl.[7] ............................ H03G 3/00; G10H 7/00; G06F 17/10

(52) U.S. Cl. ............................ 381/63; 381/61; 84/629; 84/DIG. 26; 708/322

(58) Field of Search ................................ 381/61, 63, 1, 381/17; 84/629–631, DIG. 26; 708/322

(56) References Cited

U.S. PATENT DOCUMENTS

| | | | | | |
|---|---|---|---|---|---|
| 5,123,050 | A | * | 6/1992 | Serikawa et al. | 381/61 |
| 5,771,294 | A | * | 6/1998 | Inoue et al. | 381/17 |
| 5,774,560 | A | * | 6/1998 | Su et al. | 381/63 |
| 5,796,845 | A | * | 8/1998 | Serikawa et al. | 381/1 |
| 5,995,542 | A | * | 11/1999 | Goeckler | 375/229 |

FOREIGN PATENT DOCUMENTS

| | | |
|---|---|---|
| JP | 61-296896 | 12/1986 |
| JP | 62-53100 | 3/1987 |
| JP | 04-240896 | 8/1992 |
| JP | 05-143089 | 6/1993 |
| JP | 05-165485 | 7/1993 |
| JP | 05-232979 | 9/1993 |
| JP | 70-28482 | 1/1995 |

* cited by examiner

*Primary Examiner*—Forester W. Isen
*Assistant Examiner*—Laura A. Grier
(74) *Attorney, Agent, or Firm*—Pillsbury Winthrop LLP

(57) ABSTRACT

A reflection sound generator has a first filter of Finite Impulse Response (FIR) type that is provided with a first set of parameters representing a first distribution pattern of reflection sounds, and a second FIR-type filter provided with a second set of parameters representing a second distribution pattern of additional reflection sounds. The first distribution pattern has a time length sufficient to cover an initial reflection sound and subsequent reverberant reflection sounds which are distributed at intervals along the time. The first filter executes convolution operation of sample data of an input sound by the first set of parameters to generate first data containing a sequence of reflection sounds of the input sound. The second filter executes convolution operation of the first data by the second set of parameters to generate second data containing additional reflection sounds which fill the intervals of the reflection sounds of the input sound.

23 Claims, 6 Drawing Sheets

PRIOR ART

REFLECTION SOUND GENERATOR WITH SERIES OF MAIN AND SUPPLEMENTARY FIR FILTERS

BACKGROUND OF THE INVENTION

This invention relates to a reflection sound generator for generating reflection sounds of an input sound signal using an FIR (Finite Impulse Response) filter. The reflection sound generator allows a greater number of reflection sounds to be generated from a smaller number of parameters, and the reflection sound generator further makes it easy to set and change reverberation characteristics of a sound field such as room size and liveness.

The reflection sound generator using the FIR filter is a device to carry out convolution operation of an input sound signal based on reflection sound parameters, which determine a sequence of or group of reflection sounds in terms of respective delay times and gains or magnitudes, to produce reflected and reverberated sounds. Such a device is used in various applications, for example, for creating the realism of any sound field space (e.g., a hall space) in a limited space (e.g., small room). It may also be provided in an acoustic feedback system for adjusting reverberation characteristics of a room (e.g., a music listening room) or a hall, or for prolonging a reverberation time.

FIG. 2 shows the most basic structure of a reflection sound generator using a conventional FIR filter. This device is designed to produce reflection sounds through one FIR filter 10. For the FIR filter 10, as shown in FIG. 3(*a*), for example, a set of reflection sound parameters is installed such that a sequence of reflection sounds are generated at proper time intervals while their magnitudes gradually decrease to attenuate with time. The FIR filter 10 carries out the convolution operation of an input sound signal based of the reflection sound parameter set to generate a corresponding reflection sound signal.

The time interval At tuned by the FIR filter 10 can be lengthened or shortened throughout its full time domain, thereby causing a variation of room size. For example, as shown in FIG. 3(*b*), the time interval At of the FIR filter 10 can be lengthened so that the audience can feel the room to become wider. Gains of the reflection sound parameters can also be changed in proportion to the delay times of the respective reflection sounds while maintaining the time interval At, resulting in a variation of liveness. For example, as shown in FIG. 3(*c*), each gain can be raised in proportion to each delay time to create a live sound field.

According to the structure of the reflection sound generator of FIG. 2, the number of parameters set for the FIR filter 10 is, however, required to correspond to the number of reflection sounds (equivalent to the number of taps of the device) to be generated. To solve this problem, another type of reflection sound generator such as shown in FIG. 4 has been proposed. In this reflection sound generator, a plurality of FIR filters 12, 14, 16 are connected in series while respective outputs of the FIR filters 12, 14, 16 are coupled commonly to an adder 17 to generate resultant output sounds. FIGS. 5(*a*), 5(*b*) and 5(*c*) show reflection sound-parameters of the FIR filters 12, 14, 16, respectively. As shown, the first FIR filter 12 generates a top part containing an initial reflection sound. Based on the initial reflection sound part, the second FIR filter 14 generates a reverberant reflection sound part following the initial reflection sound part. Then, based on the reverberant reflection sound part, the third FIR filter 16 generates a further reverberant reflection sound part following the reverberant reflection sound part. In this case, the next-stage reflection sounds are generated based on the previous-stage reflection sounds, so that the density of reflection sounds gradually increases along the time axis, thereby generating a greater number of reflection sounds from a smaller number of parameters.

The structure of the reflection sound generator of FIG. 4, having the reflection sound parameters shown in FIGS. 5(*a*), 5(*b*) and 5(*c*), however, raises another problem with respect to setting and changing of reverberation characteristics such as the room size and the liveness. In other words, the setting and changing of reverberation characteristics requires respective parameters to be adjusted for each FIR filter 12, 14, 16, and this adjustment.makes it hard to freely set and change the reverberation characteristics.

SUMMARY OF THE INVENTION

The present invention has been made to solve the problems in the conventional technology, and it is an object of the invention to provide a reflection sound generator that allows a greater number of reflection sounds to be generated from a smaller number of parameters, and that further makes it easy to set and change reverberation characteristics such as room size and liveness.

The inventive apparatus is constructed for processing an input sound to generate a sequence of reflection sounds along a time axis including an initial reflection sound and subsequent reverberant reflection sounds. In the inventive apparatus, a first filter of Finite Impulse Response type is provided with a first set of parameters representing a first distribution pattern of reflection sounds. The first distribution pattern has a time length sufficient to cover the initial reflection sound and the subsequent reverberant reflection sounds. Each parameter determines a magnitude (gain) and a delay time of each reflection sound such that the reflection sounds are distributed at intervals along the time axis and such that the magnitudes of the reflection sounds gradually decrease along the time axis. The first filter executes convolution operation of sample data of the input sound by the first set of parameters to generate first data containing a sequence of reflection sounds of the input sound. A second filter of Finite Impulse Response type is provided with a second set of parameters representing a second distribution pattern of additional reflection sounds. The second distribution pattern has a time length shorter than that of the first distribution pattern and longer than each interval of the reflection sounds. Each parameter determines a magnitude and a delay time of each additional reflection sound such that the additional reflection sounds are arranged at intervals shorter than those of the reflection sounds. The second filter executes convolution operation of the first data by the second set of parameters to generate second data containing additional reflection sounds which fill the intervals of the reflection sounds of the input sound.

Preferably, the second filter is provided with the second set of parameters designed such that the magnitudes of the additional reflection sounds gradually decrease along the time axis.

Preferably, the first filter is provided with the first set of parameters designed such that the reflection sounds are distributed at variable intervals, which become gradually short along the time axis.

Preferably, the first filter is provided with the first set of parameters, which can be altered to expand or contract the intervals of the reflection sounds while maintaining relative proportions of the magnitudes thereof so as to change.a rate of attenuation of the reflection sounds along the time axis.

Preferably, the first filter is provided with the first set of parameters, which can be altered to increase or decrease the magnitudes of the reflection sounds in proportion to the delay times of the reflection sounds while maintaining the intervals of the reflection sounds so as to change a rate of attenuation of the reflection sounds along the time axis.

Preferably, the first filter is provided with the first set of parameters, which can be altered so as to periodically fluctuate the delay times of the respective reflection sounds independently from each other along the time axis.

Preferably, the second filter is provided with the second set of parameters, which can be altered so as to periodically fluctuate the delay times of the respective additional reflection sounds independently from each other along the time axis.

Preferably, the first filter is provided with the first set of parameters containing a first direct parameter effective to generate a first direct sound identical to the input sound in precedence to the sequence of the reflection sounds of the input sound by a first lead interval, and the second filter is provided with the second set of parameters containing a second direct parameter effective to generate a second direct sound identical to the first direct sound in precedence to the additional reflection sounds by a second lead interval which is set comparable to the first lead interval.

According to the present invention, there is provided the reflection sound generator using the series connection of the first FIR filter and the second FIR filter. For the first FIR filter (main filter), the first set of reflection sound parameters is set in correspondence to a reflection sound group being generated throughout the entire time domain covering the initial reflection sound and the subsequent reverberant reflection sounds at relatively scattered and irregular time intervals, and being attenuated as delay time elapses. Namely, the first FIR filter carries out the convolution operation of the sample data of the input sound signal based on the first reflection sound parameter set to generate the first reflection sound data. For the second FIR filter (supplementary filter), the second set of reflection sound parameters is set in correspondence to another reflection sound group being generated at irregular but denser time intervals than those of the reflection sound group generated by the first reflection sound parameter set. The overall time length of the second reflection sound group is set longer than any of reflection sound generation intervals of the first reflection sound group and shorter than the overall time length of the first reflection sound group. The second FIR filter carries out the convolution operation of the first reflection sound data generated through the first FIR filter based on the second reflection sound parameter set so as to generate the second reflection sound data for filling out the reflection sound generation intervals of the first FIR filter.

According to the present invention, the second FIR filter produces the additional reflection sounds based on the reflection sounds produced through the first FIR filter, to fill out the reflection sound generation intervals of the first FIR filter. This makes it possible to generate a greater number of reflection sounds from a smaller number of parameters. Further, the first reflection sound parameters produce the sequence of reflection sounds throughout the entire time domain covering the initial reflection sound and the later reverberant reflection sounds, so that the total attenuation characteristics of the reverberation can be mainly determined based on the setting of the first FIR filter. Thus, the reverberation characteristics such as room size and liveness can be set and changed by the first FIR filter alone, and this makes it easy to set and change the reverberation characteristics.

The second reflection sound parameters may be set such that the reflection sound group is attenuated as the delay time elapses. Further, the first reflection sound parameters may be set such that reflection sound generation intervals are gradually shortened as the delay time elapses. Such setting makes it possible to obtain more natural reverberation. Furthermore, the first reflection sound parameters alone or both the first and second reflection sound parameters may be set such that the delay time of each reflection sound is fluctuated with time in each individual cycle, thereby creating random fluctuations to the reflection sounds to prevent occurrence of coloration.

Direct sound may be output without passing the first and second FIR filters. Otherwise, The direct sound may be output through the first and second FIR filters. In such a case, the first direct sound parameter is arranged before the first reflection sound parameter set of the first FIR filter so that the input sound signal is output as it is with no time lag. On the other hand, the second direct parameter is arranged before the second reflection sound parameter set of the second FIR filter so that the direct sound data of the first FIR filter is further output from the second FIR filter as it is with no time lag. The second reflection sound parameter set is arranged after the second direct parameter with a certain lead time interval nearly equal to the lead time interval between the first direct sound parameter and the top of the first reflection sound parameter set.

DETAILED DESCRIPTION OF THE INVENTION

Figure 1:
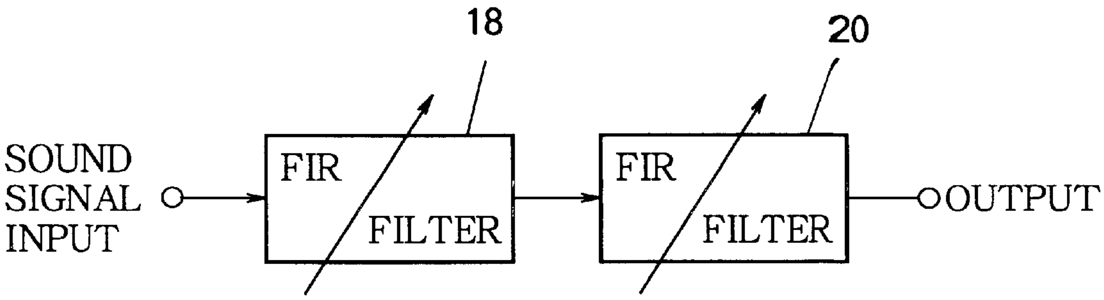
FIG. 1 is a block diagram illustrating an embodiment of the present invention.
Figure 2:
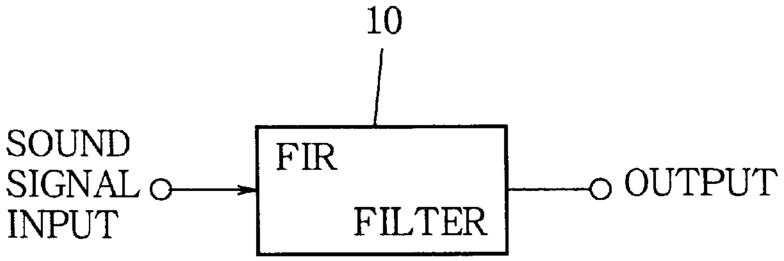
FIG. 2 PRIOR ART
FIG. 2 is a block diagram illustrating a conventional device.
Figure 3A:
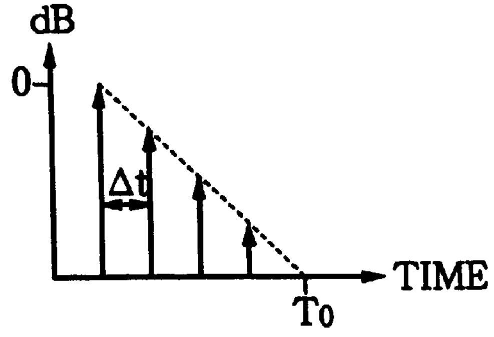
FIG.3(a) PRIOR ART
FIGS. 3(*a*), 3(*b*) and 3(*c*) are parameter diagrams of an FIR filter of FIG. 2.
Figure 3B:
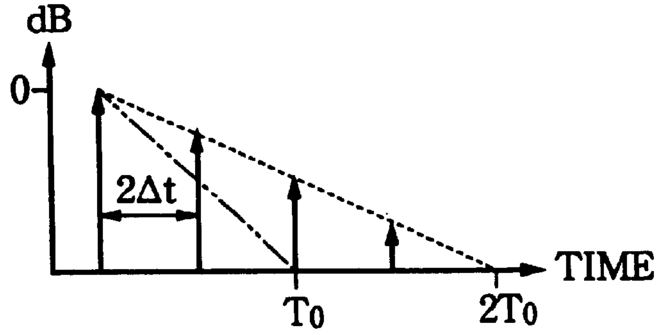
FIG.3(b) PRIOR ART
Figure 3C:
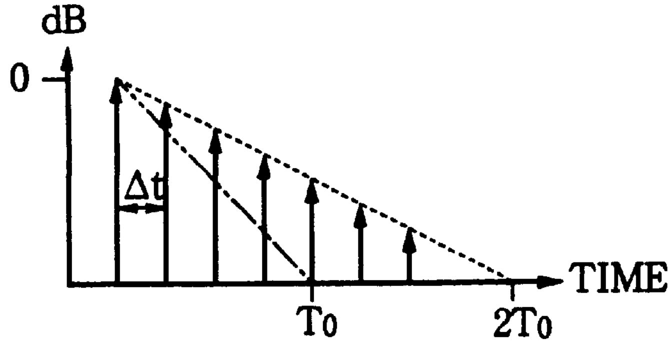
FIG.3(c) PRIOR ART
Figure 4:
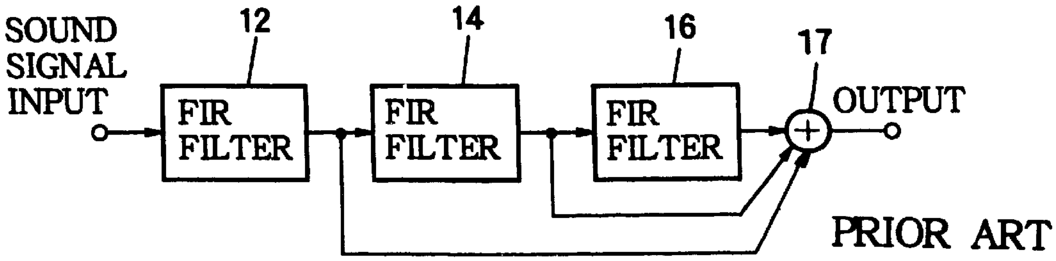
FIG. 4 is a block diagram illustrating another conventional device.
Figure 5A:
FIG.5(a) PRIOR ART
FIGS. 5(*a*), 5(*b*), 5(*c*) and 5(*d*) are parameter diagrams of FIR filters of FIG. 4.
Figure 5B:
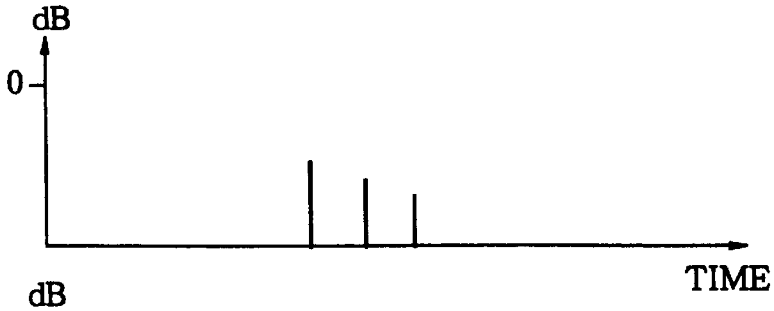
FIG.5(b) PRIOR ART
Figure 5C:
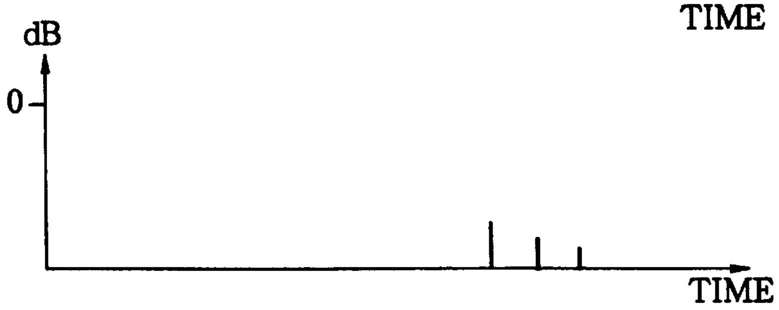
FIG.5(c) PRIOR ART
Figure 5D:
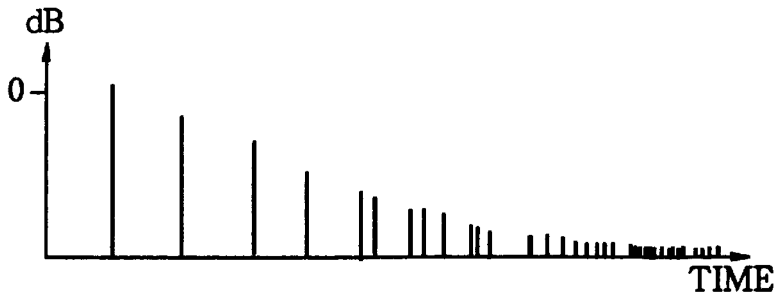
FIG.5(d) PRIOR ART

FIG. 1 shows an embodiment of the present invention. A reflection sound generator is constituted of FIR filters 18 and 20 connected in series. An input sound signal passes through the FIR filter 18 to generate a sequence of reflection sounds represented by first reflection sound data. The reflection sounds then pass through the FIR filter 20 to generate second reflection sound data representing further reflection sounds derived from the reflection sounds. The resultant reflection sounds are then output.

Figure 6A:
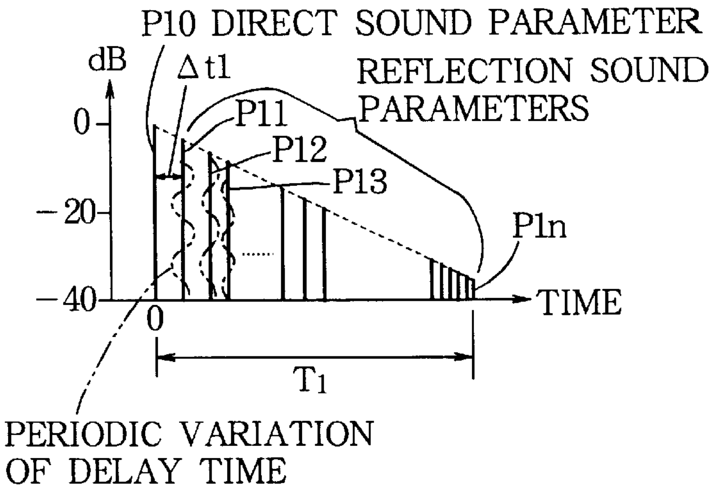
FIGS. 6(*a*), 6(*b*) and 6(*c*) are parameter diagrams of an FIR filter 18 of FIG. 1.
Figure 6B:
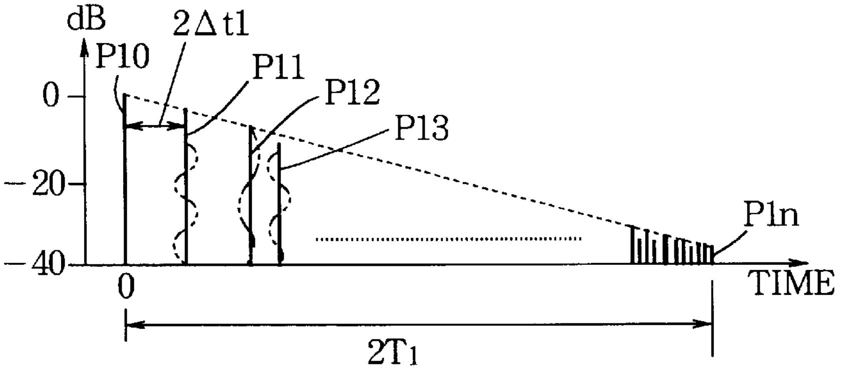
Figure 6C:
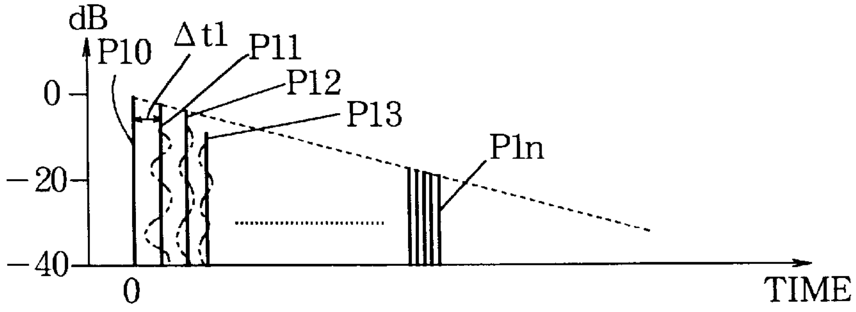

FIG. 6(*a*) shows an example of a filter characteristic set for the FIR filter 18. The filter characteristic is such that a direct sound parameter P10 is placed at the head corresponding to a first tap. The direct sound parameter P10 is so set that its delay time is 0 and gain is 0 dB, thereby creating no delay and attenuation).

Following the direct sound parameter P10, reflection sound parameters P11, P12, . . . , P1n are arranged as a first set of reflection sound parameters. A time interval Δt1 between the direct sound parameter P10 and the top reflection sound parameter P11 is set to a value corresponding to a mean free path of an assumed room or hall to be simulated by the inventive device. A time interval between the subsequent reflection sound parameters P11 and P12 is set nearly equal to or slightly shorter than the time interval Δt1. The subsequent time intervals of the reflection sound parameters P13, P14, . . . , P1n are then gradually shortened. Since the time intervals are gradually shortened, the density of the reflection sounds gradually increases, thereby suppressing comb-filter characteristics of the first FIR filter 18. The first filter 18 is provided with the first set of parameters designed such that the reflection sounds are distributed at variable intervals, which become gradually short along the time axis.

An overall time length T1 of the parameters P10, P11, . . . , P1n covers a relatively long time range throughout a time domain of an initial reflection sound and subsequent reverberant reflection sounds (e.g., one-half of the entire time length of the reverberation in a sound field to be reproduced or simulated). In this time range, the parameters P10, P11, . . . , P1n are arranged at relatively scattered intervals such that more than 30 parameters in total are distributed along the time length, for example. The parameters P10, P11, . . . , P1n are gradually attenuated as delay time elapses, thereby tracing a predetermined attenuation curve. A gain or magnitude of the last parameter P1n is set to −30 dB relative to the direct sound parameter P10. Namely, the first filter 18 of Finite Impulse Response type is provided with the first set of parameters representing a first distribution pattern of reflection sounds shown in FIG. 6(*a*). The first distribution pattern has the time length Ti sufficient to cover the initial reflection sound and the subsequent reverberant reflection sounds. Each parameter determines a magnitude and a delay time of each reflection sound such that the reflection sounds are distributed at intervals along the time axis and such that the magnitudes of the reflection sounds gradually decrease along the time axis. Each delay time of the reflection sound parameters P11, P12, . . . , P1n varies with time, as shown by the double-dot-and-dash line in FIG. 6(*a*), with a predetermined amplitude in each individual cycle. This makes it possible to prevent occurrence of coloration. Namely, the first filter 18 is provided with the first set of parameters, which can be altered so as to periodically fluctuate the delay times of the respective reflection sounds independently from each other along the time axis.

Time intervals of the parameters P10, P11, . . . , P1n can be lengthened or shortened throughout the time domain, as shown in FIG. 6(*b*), while maintaining mutual proportions thereof, thereby changing the room size. Namely, the first filter 18 is provided with the first set of parameters, which can be altered to expand or contract the intervals of the reflection sounds while maintaining relative proportions of the magnitudes thereof so as to change a rate of attenuation of the reflection sounds along the time axis. Gains or magnitudes of the parameters P10, P11, . . . , P1n can also be increased or decreased according to each delay time as shown in FIG. 6(*c*) (i.e., the longer the delay time, the greater the increase/decrease rate is made), while maintaining the time interval of each parameter, thereby changing the liveness. Namely, the first filter 18 is provided with the first set of parameters, which can be altered to increase or decrease the magnitudes of the reflection sounds in proportion to the delay times of the reflection sounds while maintaining the intervals of the reflection sounds so as to change a rate of attenuation of the reflection sounds along the time axis.

Figure 7:
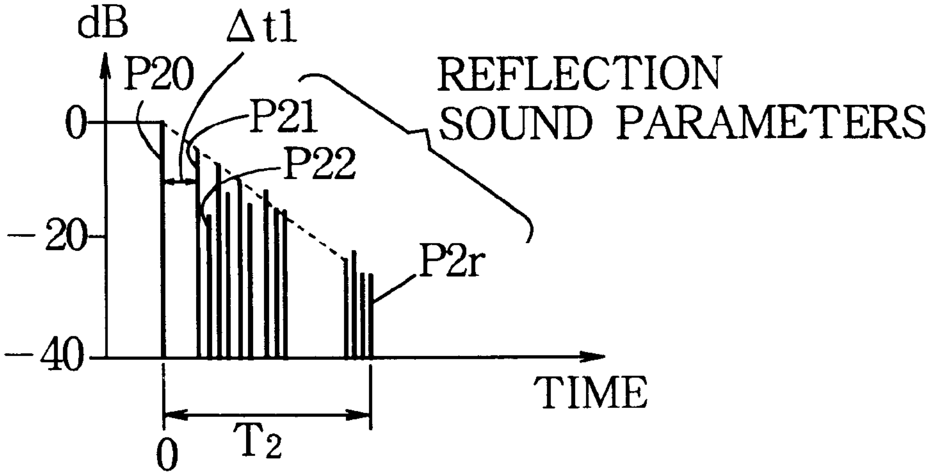
FIG. 7 is a parameter diagram of an FIR filter 20 of FIG. 1.

FIG. 7 shows an example of a filter characteristic set for the second FIR filter 20. The filter characteristic is set such that a direct parameter P20 is placed at the top corresponding to a first tap so that the output of the first FIR filter 18 is passed as it is from the first tap. The direct parameter P20 is so set that its delay time is 0 and gain is 0 dB to create no delay and attenuation. Following the parameter P20, reflection sound parameters P21, P22, . . . , P2r are arranged as a second set of reflection sound parameters. A time interval Δt1 between the direct parameter P20 and the first reflection sound parameter P21 is set nearly equal to (or slightly longer than) the time interval Δt1 between the direct sound parameter P10 and the leading reflection sound parameter P11 set for the FIR filter 18, thereby preventing any other reflection sound from being inserted between the direct sound corresponding to the parameter P10 and the leading reflection sound corresponding to the parameter P11 generated through the FIR filter 18. Namely, the first filter 18 is provided with the first set of parameters containing the first direct parameter P10 effective to generate a first direct sound identical to the input sound in precedence to the sequence of the reflection sounds of the input sound by the first lead interval Δt1. The second filter 20 is provided with the second set of parameters containing the second direct parameter P20 effective to generate a second direct sound identical to the first direct sound in precedence to the additional reflection sounds by the second lead interval Δt1 which is set comparable to the first lead interval Δt1. Time intervals of the reflection sound parameters P21, P22, . . . , P2r are set at random but much shorter than Δt1. An overall time length T2 of the parameters P20, P21, . . . , P2r is set longer than each time interval of the parameters P10, P11, . . . , P1n of the FIR filter 18, and is set shorter than the overall time length T1 of the parameters P10, P11, . . . , P1n. The number of the parameters P20, P21, . . . , P2r corresponding to the number of taps may be 30 or more. Namely, the second filter 20 of Finite Impulse Response type is provided with the second set of parameters representing a second distribution pattern of additional reflection sounds. As shown in FIG. 7, the second distribution pattern has the time length T2 shorter than the time length T1 of the first distribution pattern and longer than each interval of the reflection sounds P10, P11, . . . , P1n of the first distribution pattern. Each parameter P20, P21, . . . , P2r determines the magnitude and delay time of each additional reflection sound such that the additional reflection sounds are arranged at intervals P20, P21, . . . , P2r shorter than those of the reflection sounds P10, P11, . . . , P1n.

The direct sound parameter P20 and the subsequent reflection sound parameters P21, P22, . . . , P2r are gradually attenuated along a predetermined attenuation curve. Namely, the second filter 20 is provided with the second set of parameters designed such that the magnitudes of the additional reflection sounds gradually decrease along the time axis. Gains of the reflection sound parameters P21, P22, . . . , P2r are preferably set not to exceed a maximum of 0 dB that is a gain of 1. A gain of the last parameter P2r is set below −20 dB, for example, relative to the parameter P20. Each delay time of the parameters P20, P21, . . . , P2r may be fluctuated with time in each individual cycle, as required, in the same manner as the parameters P10, P11, . . . , P1n of the FIR filter 18. Namely, the second filter 20 is provided with the second set of parameters, which can be altered so as to periodically fluctuate the delay times of the respective additional reflection sounds independently from each other along the time axis.

Figure 8:
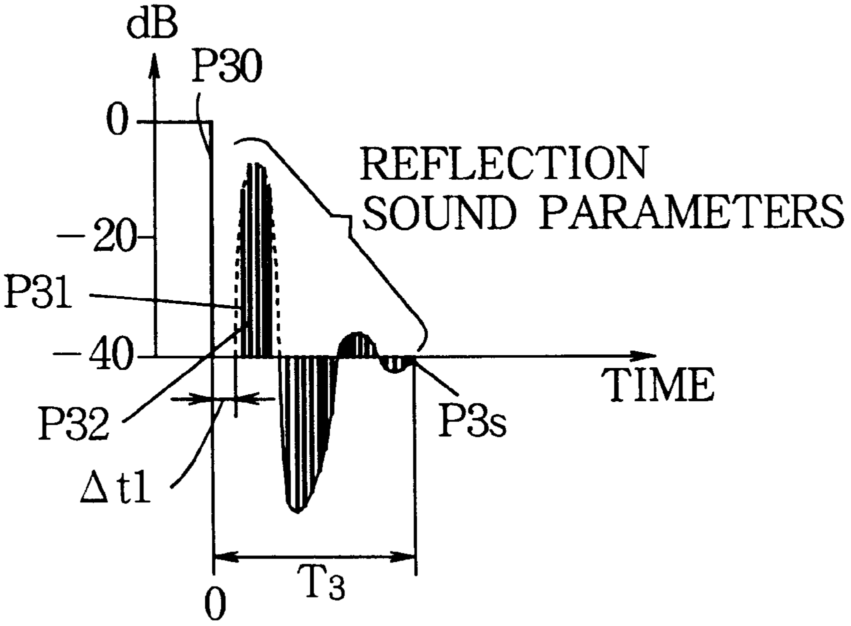
FIG. 8 is another parameter diagram of the FIR filter 20 of FIG. 1.

FIG. 8 shows another example of a filter characteristic set for the FIR filter 20. The filter characteristic is such that a direct parameter P30 is placed at the top corresponding to the first tap so that the output of the FIR filter 18 is passed as it is from the first tap. The parameter P30 is so set that its delay time is 0 and gain is 0 dB to cause no delay and attenuation. Following the parameter P30, reflection sound parameters P31, P32, . . . , P3s are arranged. A time interval Δt1 between the direct parameter P30 and the first reflection sound parameter P31 is set nearly equal to the time interval Δt1 between the direct sound parameter P10 and the first reflection sound parameter P11 of the FIR filter 18. Time intervals of the reflection sound parameters P31, P32, . . . , P3s are set at random but much shorter than Δt1. An overall time length T3 of the parameters P30, P31, . . . , P3s is set longer than each time interval of the parameters P10, P11, . . . , P1n of the FIR filter 18, and is set shorter than the total time length T1 of the parameters P10, P11, . . . , P1n. The number of the parameters P30, P31, . . . , P3s corresponding to the number of taps may be 30 or more.

The direct sound parameter P30 and the subsequent reflection sound parameters P31, P32, . . . , P3s are gradually attenuated along a predetermined attenuation curve. Here, an attenuation characteristic is so designed that the reflection sounds are attenuated while being swung up and down with respect to a center level at the order of −40 dB. Gains of the reflection sound parameters P31, P32, . . . , P3s are preferably set not to exceed a maximum of 0 dB that is a gain of 1. Each delay time of the parameters P30, P31, . . . , P3s may be fluctuated with time in each individual cycle, as required, in the same manner as the parameters P10, P11, . . . , P1n of the FIR filter 18.

When the room size is to be changed, the delay time of the FIR filter 20 is preferably varied in synchronization with the variation of the delay time of the FIR filter 18. For example, as shown in FIG. 6(*b*), if the time interval between the parameters P10 and P11 is changed to 2Δt1, the time interval between the parameters P20 and P21 of FIG. 7, and the time interval between the parameters P30 and P31 of FIG. 8 should be changed to 2Δt1 as well. Not only is the time interval between the parameters P20 and P21 or the parameters P30 and P31 changed, but also time intervals of the parameter P21 and the subsequent parameters or the parameter P31 and the subsequent parameters can also be changed. In case of FIG. 6(*b*), each time interval of the parameter P21 and the subsequent parameters or the parameter P31 and the subsequent parameters can be doubled. On the other hand, when the liveness is to be changed, the gain of the FIR filter 20 should be varied in synchronization with the variation of the gain of the FIR filter 18. In other words, the gain of each reflection sound parameter can be increased or decreased according to the delay time. Namely, the longer the delay time, the greater the increase/decrease rate is made.

According to the above structure, the second FIR filter generates the final reflection sound data based on the intermediate reflection sound data produced through the first FIR filter 18 so as to fill out reflection sound generation intervals of the first FIR filter 18. Namely, the first filter executes the convolution operation of sample data of the input sound based on the first set of parameters to generate first data containing a sequence of reflection sounds of the input sound. Then, the second filter executes the convolution operation of the first data based on the second set of parameters to generate second data containing additional reflection sounds which fill the intervals of the reflection sounds of the input sound. This makes it possible to generate a greater number of reflection sounds from a smaller number of parameters, resulting in a smaller number of taps. In addition, the reflection sound generation intervals of the first reflection sound parameters are gradually shortened, so that the density of the reflection sounds and additional reflection sounds increases, thus obtaining more natural reverberation. On the other hand, the total attenuation characteristic of reverberation is mainly determined based on the setting of the first FIR filter 18, so that the reverberation characteristics such as room size and liveness can be set or changed by the first FIR filter 18 alone. This makes it easy to set and change the reverberation characteristics.

Figure 9:
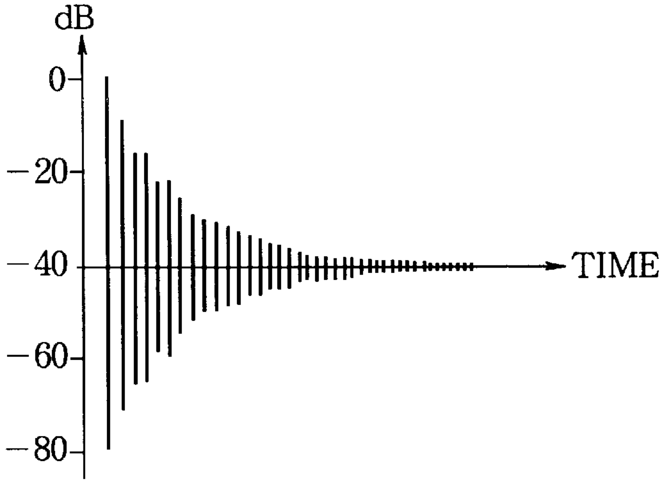
FIGS. 9(*a*), 9(*b*) and 9(*c*) are simulation diagrams of the structure of FIG. 1.
Figure 9:
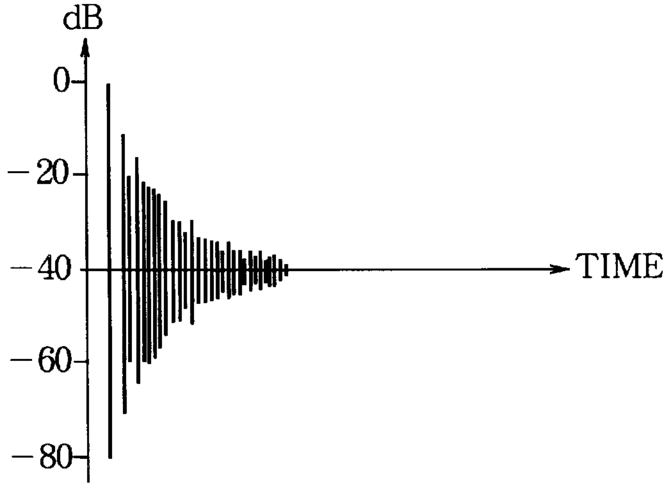
Figure 9:
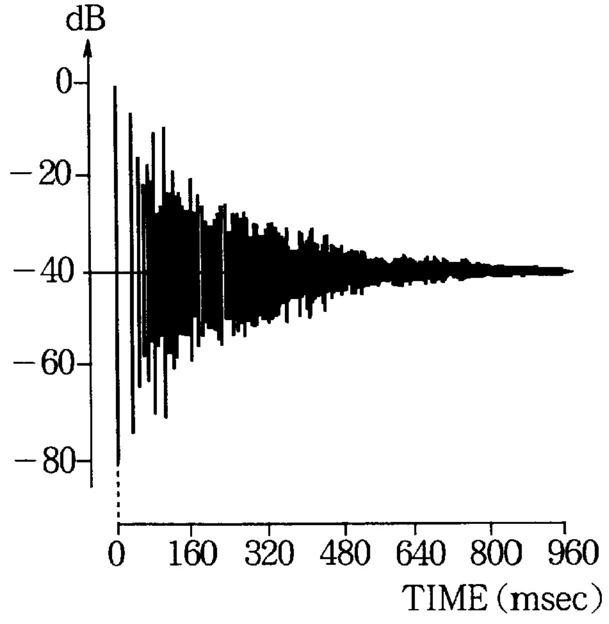

FIGS. 9(*a*), 9(*b*) and 9(*c*) show simulation results of the structure of FIG. 1. FIG. 9(*a*) shows the distribution pattern of the parameters set to the FIR filter 18, FIG. 9(*b*) shows the distribution pattern of parameters set to the FIR filter 20. FIG. 9(*c*) shows the composite distribution pattern of parameters of the entire circuitry. It is apparent from FIG. 9(*c*) that the density of reverberant reflection sounds increases with time, and that the attenuation characteristic is roughly traced along that of the FIR filter 18.

What is claimed is:

1. An apparatus for processing an input sound to generate a sequence of reflection sounds along a time axis including an initial reflection sound and subsequent reverberant reflection sounds, the apparatus comprising:

a first filter of Finite Impulse Response type being provided with a first set of parameters representing a first distribution pattern of reflection sounds, the first distribution pattern having a first time length sufficient to cover the initial reflection sound and the subsequent reverberant reflection sounds, each parameter determining a first magnitude and a first delay time of each reflection sound such that the reflection sounds are distributed at intervals along the time axis and such that the magnitudes of the reflection sounds gradually decrease along the time axis, the first filter executing convolution operation of sample data of the input sound by the first set of parameters to generate first data containing a sequence of reflection sounds of the input sound; and a second filter of Finite Impulse Response type being provided with a second set of parameters representing a second distribution pattern of additional reflection sounds, the second distribution pattern having a second time length shorter than that of the first distribution pattern and longer than each interval of the reflection sounds, each parameter determining a second magnitude and a second delay time of each additional reflection sound such that the additional reflection sounds are arranged at intervals shorter than those of the reflection sounds, the second filter executing convolution operation of the first data by the second set of parameters to generate second data containing additional reflection sounds which fill the intervals of the reflection sounds of the input sound.

2. The apparatus according to claim 1, wherein the second filter is provided with the second set of parameters designed such that the magnitudes of the additional reflection sounds gradually decrease along the time axis.

3. The apparatus according to claim 1, wherein the first filter is provided with the first set of parameters designed such that the reflection sounds are distributed at variable intervals, which become gradually short along the time axis.

4. An apparatus for processing an input sound to generate a sequence of reflection sounds along a time axis including an initial reflection sound and subsequent reverberant reflection sounds, the apparatus comprising:

a first filter of Finite Impulse Response type being provided with a first set of parameters representing a first distribution pattern of reflection sounds, the first distribution pattern having a first time length sufficient to cover the initial reflection sound and the subsequent reverberant reflection sounds, each parameter determining a first magnitude and a first delay time of each reflection sound such that the reflection sounds are distributed at intervals along the time axis and such that the magnitudes of the reflection sounds gradually decrease along the time axis, the first filter executing convolution operation of sample data of the input sound by the first set of parameters to generate first data containing a sequence of reflection sounds of the input sound; and a second filter of Finite Impulse Response type being provided with a second set of parameters representing a second distribution pattern of additional reflection sounds, the second distribution pattern having a second time length shorter than that of the first distribution pattern and longer than each interval of the reflection sounds, each parameter determining a second magnitude and a second delay time of each additional reflection sound such that the additional reflection sounds are arranged at intervals shorter than those of the reflection sounds, the second filter executing convolution operation of the first data by the second set of parameters to generate second data containing additional reflection sounds which fill the intervals of the reflection sounds of the input sound, wherein said first set of parameters can be altered to expand or contract the intervals of the reflection sounds while maintaining relative proportions of the magnitudes thereof so as to change a rate of attenuation of the reflection sounds along the time axis.

5. An apparatus for processing an input sound to generate a sequence of reflection sounds along a time axis including an initial reflection sound and subsequent reverberant reflection sounds, the apparatus comprising:

a first filter of Finite Impulse Response type being provided with a first set of parameters representing a first distribution pattern of reflection sounds, the first distribution pattern having a first time length sufficient to cover the initial reflection sound and the subsequent reverberant reflection sounds, each parameter determining a first magnitude and a first delay time of each reflection sound such that the reflection sounds are distributed at intervals along the time axis and such that the magnitudes of the reflection sounds gradually decrease along the time axis, the first filter executing convolution operation of sample data of the input sound by the first set of parameters to generate first data containing a sequence of reflection sounds of the input sound; and a second filter of Finite Impulse Response type being provided with a second set of parameters representing a second distribution pattern of additional reflection sounds, the second distribution pattern having a second time length shorter than that of the first distribution pattern and longer than each interval of the reflection sounds, each parameter determining a second magnitude and a second delay time of each additional reflection sound such that the additional reflection sounds are arranged at intervals shorter than those of the reflection sounds, the second filter executing convolution operation of the first data by the second set of parameters to generate second data containing additional reflection sounds which fill the intervals of the reflection sounds of the input sound, wherein said first set of parameters can be altered to increase or decrease the magnitudes of the reflection sounds in proportion to the delay times of the reflection sounds while maintaining the intervals of the reflection sounds so as to change a rate of attenuation of the reflection sounds along the time axis.

6. An apparatus for processing an input sound to generate a sequence of reflection sounds along a time axis including an initial reflection sound and subsequent reverberant reflection sounds, the apparatus comprising:

a first filter of Finite Impulse Response type being provided with a first set of parameters representing a first distribution pattern of reflection sounds, the first distribution pattern having a first time length sufficient to cover the initial reflection sound and the subsequent reverberant reflection sounds, each parameter determining a first magnitude and a first delay time of each reflection sound such that the reflection sounds are distributed at intervals along the time axis and such that the magnitudes of the reflection sounds gradually decrease along the time axis, the first filter executing convolution operation of sample data of the input sound by the first set of parameters to generate first data containing a sequence of reflection sounds of the input sound; and a second filter of Finite Impulse Response type being provided with a second set of parameters representing a second distribution pattern of additional reflection sounds, the second distribution pattern having a second time length shorter than that of the first distribution pattern and longer than each interval of the reflection sounds, each parameter determining a second magnitude and a second delay time of each additional reflection sound such that the additional reflection sounds are arranged at intervals shorter than those of the reflection sounds, the second filter executing convolution operation of the first data by the second set of parameters to generate second data containing additional reflection sounds which fill the intervals of the reflection sounds of the input sound, wherein said first set of parameters can be altered so as to periodically fluctuate the delay times of the respective reflection sounds independently from each other along the time axis.

7. An apparatus for processing an input sound to generate a sequence of reflection sounds along a time axis including an initial reflection sound and subsequent reverberant reflection sounds, the apparatus comprising:

a first filter of Finite Impulse Response type being provided with a first set of parameters representing a first distribution pattern of reflection sounds, the first distribution pattern having a first time length sufficient to cover the initial reflection sound and the subsequent reverberant reflection sounds, each parameter determining a first magnitude and a first delay time of each reflection sound such that the reflection sounds are distributed at intervals along the time axis and such that the magnitudes of the reflection sounds gradually decrease along the time axis, the first filter executing convolution operation of sample data of the input sound by the first set of parameters to generate first data containing a sequence of reflection sounds of the input sound; and a second filter of Finite Impulse Response type being provided with a second set of parameters representing a second distribution pattern of additional reflection sounds, the second distribution pattern having a second time length shorter than that of the first distribution pattern and longer than each interval of the reflection sounds, each parameter determining a second magnitude and a second delay time of each additional reflection sound such that the additional reflection sounds are arranged at intervals shorter than those of the reflection sounds, the second filter executing convolution operation of the first data by the second set of parameters to generate second data containing additional reflection sounds which fill the intervals of the reflection sounds of the input sound, wherein said second set of parameters can be altered so as to periodically fluctuate the delay times of the respective additional reflection sounds independently from each other along the time axis.

8. An apparatus for processing an input sound to generate a sequence of reflection sounds along a time axis including an initial reflection sound and subsequent reverberant reflection sounds, the apparatus comprising:

a first filter of Finite Impulse Response type being provided with a first set of parameters representing a first distribution pattern of reflection sounds, the first distribution pattern having a first time length sufficient to cover the initial reflection sound and the subsequent reverberant reflection sounds, each parameter determining a first magnitude and a first delay time of each reflection sound such that the reflection sounds are distributed at intervals along the time axis and such that the magnitudes of the reflection sounds gradually decrease along the time axis, the first filter executing convolution operation of sample data of the input sound by the first set of parameters to generate first data containing a sequence of reflection sounds of the input sound; and a second filter of Finite Impulse Response type being provided with a second set of parameters representing a second distribution pattern of additional reflection sounds, the second distribution pattern having a second time length shorter than that of the first distribution pattern and longer than each interval of the reflection sounds, each parameter determining a second magnitude and a second delay time of each additional reflection sound such that the additional reflection sounds are arranged at intervals shorter than those of the reflection sounds, the second filter executing convolution operation of the first data by the second set of parameters to generate second data containing additional reflection sounds which fill the intervals of the reflection sounds of the input sound, wherein said first set of parameters contains a first direct parameter effective to generate a first direct sound identical to the input sound in precedence to the sequence of the reflection sounds of the input sound by a first lead interval, and wherein said second set of parameters contains a second direct parameter effective to generate a second direct sound identical to the first direct sound in precedence to the additional reflection sounds by a second lead interval which is set comparable to the first lead interval.

9. A method of processing an input sound to generate a sequence of reflection sounds along a time axis including an initial reflection sound and subsequent reverberant reflection sounds, the method comprising the steps of:

providing a first set of parameters representing a first distribution pattern of reflection sounds, the first distribution pattern having a first time length sufficient to cover the initial reflection sound and the subsequent reverberant reflection sounds, each parameter determining a first magnitude and a first delay time of each reflection sound such that the reflection sounds are distributed at intervals along the time axis and such that the magnitudes of the reflection sounds gradually decrease along the time axis;

subsequently providing a second set of parameters representing a second distribution pattern of additional reflection sounds, the second distribution pattern having a second time length shorter than that of the first distribution pattern and longer than each interval of the reflection sounds, each parameter determining a second magnitude and a second delay time of each additional reflection sound such that the additional reflection sounds are arranged at intervals shorter than those of the reflection sounds;

executing convolution operation of sample data of the input sound based on the first set of parameters to generate first data containing a sequence of reflection sounds of the input sound; and subsequently executing convolution operation of the first data based on the second set of parameters to generate second data containing additional reflection sounds which fill the intervals of the reflection sounds of the input sound.

10. The method according to claim 9, wherein the step of subsequently providing provides the second set of parameters designed such that the magnitudes of the additional reflection sounds gradually decrease along the time axis.

11. The method according to claim 9, wherein the step of providing provides the first set of parameters designed such that the reflection sounds are distributed at variable intervals, which become gradually short along the time axis.

12. A method of processing an input sound to generate a sequence of reflection sounds along a time axis including an initial reflection sound and subsequent reverberant reflection sounds, the method comprising the steps of:

providing a first set of parameters representing a first distribution pattern of reflection sounds, the first distribution pattern having a first time length sufficient to cover the initial reflection sound and the subsequent reverberant reflection sounds, each parameter determining a first magnitude and a first delay time of each reflection sound such that the reflection sounds are distributed at intervals along the time axis and such that the magnitudes of the reflection sounds gradually decrease along the time axis;

subsequently providing a second set of parameters representing a second distribution pattern of additional reflection sounds, the second distribution pattern having a second time length shorter than that of the first distribution pattern and longer than each interval of the reflection sounds, each parameter determining a second magnitude and a second delay time of each additional reflection sound such that the additional reflection sounds are arranged at intervals shorter than those of the reflection sounds;

executing convolution operation of sample data of the input sound based on the first set of parameters to generate first data containing a sequence of reflection sounds of the input sound; and subsequently executing convolution operation of the first data based on the second set of parameters to generate second data containing additional reflection sounds which fill the intervals of the reflection sounds of the input sound, wherein said first set of parameters can be altered to expand or contract the intervals of the reflection sounds while maintaining relative proportions of the magnitudes thereof so as to change a rate of attenuation of the reflection sounds along the time axis.

13. A method of processing an input sound to generate a sequence of reflection sounds along a time axis including an initial reflection sound and subsequent reverberant reflection sounds, the method comprising the steps of:

providing a first set of parameters representing a first distribution pattern of reflection sounds, the first distribution pattern having a first time length sufficient to cover the initial reflection sound and the subsequent reverberant reflection sounds, each parameter determining a first magnitude and a first delay time of each reflection sound such that the reflection sounds are distributed at intervals along the time axis and such that the magnitudes of the reflection sounds gradually decrease along the time axis;

subsequently providing a second set of parameters representing a second distribution pattern of additional reflection sounds, the second distribution pattern having a second time length shorter than that of the first distribution pattern and longer than each interval of the reflection sounds, each parameter determining a second magnitude and a second delay time of each additional reflection sound such that the additional reflection sounds are arranged at intervals shorter than those of the reflection sounds;

executing convolution operation of sample data of the input sound based on the first set of parameters to generate first data containing a sequence of reflection sounds of the input sound; and subsequently executing convolution operation of the first data based on the second set of parameters to generate second data containing additional reflection sounds which fill the intervals of the reflection sounds of the input sound, wherein said first set of parameters can be altered to increase or decrease the magnitudes of the reflection sounds in proportion to the delay times of the reflection sounds while maintaining the intervals of the reflection sounds so as to change a rate of attenuation of the reflection sounds along the time axis.

14. A method of processing an input sound to generate a sequence of reflection sounds along a time axis including an initial reflection sound and subsequent reverberant reflection sounds, the method comprising the steps of:

providing a first set of parameters representing a first distribution pattern of reflection sounds, the first distribution pattern having a first time length sufficient to cover the initial reflection sound and the subsequent reverberant reflection sounds, each parameter determining a first magnitude and a first delay time of each reflection sound such that the reflection sounds are distributed at intervals along the time axis and such that the magnitudes of the reflection sounds gradually decrease along the time axis;

subsequently providing a second set of parameters representing a second distribution pattern of additional reflection sounds, the second distribution pattern having a second time length shorter than that of the first distribution pattern and longer than each interval of the reflection sounds, each parameter determining a second magnitude and a second delay time of each additional reflection sound such that the additional reflection sounds are arranged at intervals shorter than those of the reflection sounds;

executing convolution operation of sample data of the input sound based on the first set of parameters to generate first data containing a sequence of reflection sounds of the input sound; and subsequently executing convolution operation of the first data based on the second set of parameters to generate second data containing additional reflection sounds which fill the intervals of the reflection sounds of the input sound, wherein said first set of parameters can be altered so as to periodically fluctuate the delay times of the respective reflection sounds independently from each other along the time axis.

15. A method of processing an input sound to generate a sequence of reflection sounds along a time axis including an initial reflection sound and subsequent reverberant reflection sounds, the method comprising the steps of:

providing a first set of parameters representing a first distribution pattern of reflection sounds, the first distribution pattern having a first time length sufficient to cover the initial reflection sound and the subsequent reverberant reflection sounds, each parameter determining a first magnitude and a first delay time of each reflection sound such that the reflection sounds are distributed at intervals along the time axis and such that the magnitudes of the reflection sounds gradually decrease along the time axis;

subsequently providing a second set of parameters representing a second distribution pattern of additional reflection sounds, the second distribution pattern having a second time length shorter than that of the first distribution pattern and longer than each interval of the reflection sounds, each parameter determining a second magnitude and a second delay time of each additional reflection sound such that the additional reflection sounds are arranged at intervals shorter than those of the reflection sounds;

executing convolution operation of sample data of the input sound based on the first set of parameters to generate first data containing a sequence of reflection sounds of the input sound; and subsequently executing convolution operation of the first data based on the second set of parameters to generate second data containing additional reflection sounds which fill the intervals of the reflection sounds of the input sound, wherein said second set of parameters can be altered so as to periodically fluctuate the delay times of the respective additional reflection sounds independently from each other along the time axis.

16. A method of processing an input sound to generate a sequence of reflection sounds along a time axis including an initial reflection sound and subsequent reverberant reflection sounds, the method comprising the steps of:

providing a first set of parameters representing a first distribution pattern of reflection sounds, the first distribution pattern having a first time length sufficient to cover the initial reflection sound and the subsequent reverberant reflection sounds, each parameter determining a first magnitude and a first delay time of each reflection sound such that the reflection sounds are distributed at intervals along the time axis and such that the magnitudes of the reflection sounds gradually decrease along the time axis;

subsequently providing a second set of parameters representing a second distribution pattern of additional reflection sounds, the second distribution pattern having a second time length shorter than that of the first distribution pattern and longer than each interval of the reflection sounds, each parameter determining a second magnitude and a second delay time of each additional reflection sound such that the additional reflection sounds are arranged at intervals shorter than those of the reflection sounds;

executing convolution operation of sample data of the input sound based on the first set of parameters to generate first data containing a sequence of reflection sounds of the input sound; and subsequently executing convolution operation of the first data based on the second set of parameters to generate second data containing additional reflection sounds which fill the intervals of the reflection sounds of the input sound, wherein said first set of parameters contains a first direct parameter effective to generate a first direct sound identical to the input sound in precedence to the sequence of the reflection sounds of the input sound by a first lead interval, and wherein said second set of parameters contains a second direct parameter effective to generate a second direct sound identical to the first direct sound in precedence to the additional reflection sounds by a second lead interval which is set comparable to the first lead interval.

17. A reflection sound generating apparatus comprising a first Finite Impulse Response filter and a second Finite Impulse Response filter for inputting sample sound data and outputting first reflection sound data and second reflection sound data, wherein the first Finite Impulse Response filter is set with a first reflection sound parameter for executing convolution operation of the inputted sample sound data by the first reflection sound parameter to generate the first reflection sound data representing reflection sounds, the first reflection sound parameter being set to enable the first Finite Impulse Response filter to generate a first initial reflection sound occurring by a first delay time, and subsequent first reflection sounds occurring at variable time intervals, wherein the second Finite Impulse Response filter is set with a second reflection sound parameter for executing convolution operation of the first reflection sound data by the second reflection sound parameter to generate the second reflection sound data representing the reflection sounds, the second reflection sound parameter being set to enable the second filter to generate a second initial reflection sound occurring without a delay time, another second reflection sound occurring by a second delay time which is equal to or longer than the first delay time, and subsequent second reflection sounds occurring at variable time intervals, and wherein reflection sounds associated with the second reflection sound parameter having a first entire time length along a time axis, the first entire time length being longer than each time interval of the reflection sounds associated with the first reflection sound parameter, and the first entire time length being shorter than a second entire time length of the reflection sounds associated with the first reflection sound parameter.

18. The reflection sound generating apparatus according to claim 17, wherein the second reflection sound parameter is set such that magnitudes of the reflection sounds gradually decrease along the time axis.

19. The reflection sound generating apparatus according to claim 17, wherein the first reflection sound parameter is set such that the reflection sounds are distributed at the variable time intervals, which become gradually shorter along the time axis.

20. The reflection sound generating apparatus according to claim 17, wherein the first reflection sound parameter is modifiable to expand or contract time intervals of the reflection sounds while maintaining relative proportions of magnitudes of the reflection sounds so as to change a rate of attenuation of the reflection sounds along the time axis.

21. The reflection sound generating apparatus according to claim 17, wherein the first reflection sound parameter is modifiable to increase or decrease magnitudes of the reflection sounds in proportion to delay times of the reflection sounds while maintaining time intervals of the reflection sounds so as to change a rate of attenuation of the reflection sounds along the time axis.

22. The reflection sound generating apparatus according to claim 17, wherein the first reflection sound parameter is modifiable so as to periodically fluctuate delay times of the respective reflection sounds independently from each other along the tine axis.

23. The reflection sound generating apparatus according to claim 17, wherein the second reflection sound parameter is modifiable so as to periodically fluctuate delay times of the respective reflection sounds independently from each other along the time axis.

* * * * *